(12) United States Patent
Negishi et al.

(10) Patent No.: US 7,023,706 B2
(45) Date of Patent: Apr. 4, 2006

(54) SEMICONDUCTOR DEVICE AND MANUFACTURING THE SAME

(75) Inventors: Mikio Negishi, Komoro (JP); Hiroki Noto, Komoro (JP); Tomio Yamada, Tamamura (JP); Tsuneo Endoh, Komoro (JP)

(73) Assignee: Renesas Technology Corp., Tokyo (JP)

( * ) Notice: Subject to any disclaimer, the term of this patent is extended or adjusted under 35 U.S.C. 154(b) by 279 days.

(21) Appl. No.: 10/323,818

(22) Filed: Dec. 20, 2002

(65) Prior Publication Data

US 2003/0165052 A1 Sep. 4, 2003

(30) Foreign Application Priority Data

Mar. 1, 2002 (JP) ............................. 2002-055436

(51) Int. Cl.
*H05K 7/02* (2006.01)
*H05K 7/06* (2006.01)
*H05K 7/08* (2006.01)
*H05K 7/10* (2006.01)

(52) U.S. Cl. .................... 361/783; 174/52.4; 361/718; 361/719

(58) Field of Classification Search ........ 361/718–719, 361/783; 257/707; 174/52.4, 257
See application file for complete search history.

(56) References Cited

U.S. PATENT DOCUMENTS

| | | | |
|---|---|---|---|
| 5,295,045 A * | 3/1994 | Kitano et al. ............... | 361/813 |
| 5,355,283 A * | 10/1994 | Marrs et al. ................. | 361/760 |
| 5,796,165 A * | 8/1998 | Yoshikawa et al. ......... | 257/728 |
| 5,864,174 A * | 1/1999 | Yamada et al. ............. | 257/676 |
| 6,075,995 A * | 6/2000 | Jensen ..................... | 455/552.1 |
| 6,163,456 A * | 12/2000 | Suzuki et al. ............... | 361/704 |
| 6,833,993 B1 * | 12/2004 | Wang .......................... | 361/704 |
| 6,879,488 B1 * | 4/2005 | Takeda et al. .............. | 361/704 |
| 2004/0026777 A1 * | 2/2004 | Yokoyama et al. ......... | 257/706 |

FOREIGN PATENT DOCUMENTS

JP        2000-299427       * 10/2000

* cited by examiner

*Primary Examiner*—Kamand Cuneo
*Assistant Examiner*—Yuriy Semenenko
(74) *Attorney, Agent, or Firm*—Mattingly, Stanger, Malur & Brundidge, P.C.

(57) ABSTRACT

A semiconductor device capable of attaining the reduction of size is disclosed. The semiconductor device comprises a module substrate having a surface and a back surface, a control chip mounted on the surface of the module substrate, plural chip parts mounted on the surface in adjacency to the control chip, first and second output chips mounted on the back surface of the module substrate, plural lands formed on the back surface of the module substrate, and a seal portion formed of resin to seal the control chip and the plural chip parts, wherein the first and second output chips are larger in the amount of heat generated than the control chip, the heat from the first and second output ships is radiated to a mother board, and packaging parts on the surface side of the module substrate are sealed with only a sealing resin without using a metallic case or the like to attain the reduction in size of the module.

11 Claims, 10 Drawing Sheets

| FREQUENCY BAND | FIRST STAGE (SURFACE SIDE) | | | SECOND STAGE + FINAL STAGE (BACK SIDE) | | |
|---|---|---|---|---|---|---|
| | POWER | THERMAL RESISTANCE CONSTRAINT | SIMULATION VALUE | POWER | THERMAL RESISTANCE CONSTRAINT | SIMULATION VALUE |
| GSM SIDE | 0.2W | 250°C/W OR LESS | 70°C/W | 8W OR LESS | 6°C/W OR LESS | 3.9°C/W |

SEMICONDUCTOR DEVICE AND MANUFACTURING THE SAME

BACKGROUND OF THE INVENTION

The present invention relates to a semiconductor device manufacturing technique and more particularly to a technique applicable effectively to the reduction in size of a semiconductor module wherein semiconductor chips are mounted on both surface and back surface of a wiring substrate.

As an example of a module product (a semiconductor device) with chip parts such as chip capacitor and chip resistor as well as semiconductor chips for bare chip assembly mounted thereon, there has been developed a module called a power amplifier module, which is incorporated in a portable telephone set for example.

As to a semiconductor device (a high frequency integrated circuit device) with semiconductor chips and chip parts mounted thereon, a description thereof is found, for example, in Japanese Published Unexamined Patent Application No. 2000-299427.

In the Japanese Published Unexamined Patent Application No. 2000-299427, there is described a high frequency integrated circuit device of a structure wherein a semiconductor chip and chip parts are mounted on a surface of a multi-layer substrate and another semiconductor chip is mounted on a back surface of the same substrate, and a heat radiation cover formed of a metallic material such as aluminum is attached to the multi-layer substrate, the semiconductor chips and the chip parts being covered with the heat radiation cover.

SUMMARY OF THE INVENTION

However, in the high frequency integrated circuit device disclosed in the Japanese Published Unexamined Patent Application No. 2000-299427, it is necessary that a gap of at least 0.5 to 0.6 mm be ensured between an inner periphery wall of the heat radiation cover and chip parts disposed at the outermost periphery, thus giving rise to the problem that it is impossible to make a further reduction in size of the high frequency integrated circuit device.

More particularly, in a portable electronic device such as a portable telephone set, with a tendency to the reduction in size and thickness of the body of such an electronic device, it is required to make a further reduction in size of a packaging part such as a semiconductor device mounted on the portable electronic device, and therefore the situation where a further reduction in size of the high frequency integrated circuit device cannot be attained poses a problem.

It is an object of the present invention to provide a semiconductor device capable of being fabricated in a reduced size and a method of manufacturing the same.

It is another object of the present invention to provide a semiconductor device which can improve the heat radiation performance of a semiconductor chip, as well as a method of manufacturing the same.

It is a further object of the present invention to provide a semiconductor device which can improve the mounting performance, as well as a method of manufacturing the same.

It is a still further object of the present invention to provide a semiconductor device which can attain the reduction of cost, as well as a method of manufacturing the same.

The above and other objects and novel features of the present invention will become apparent from the following description and the accompanying drawings.

Typical inventions disclosed herein will be outlined below.

In one aspect of the present invention there is provided a semiconductor device comprising a wiring substrate, a first packaging part mounted on a surface of the wiring substrate, a second packaging part mounted on a back surface of the wiring substrate, a plurality of external terminals provided on the back surface of the wiring substrate, and a seal portion formed of resin to seal the first packaging part, the second packaging part being larger in the amount of heat generated than the first packaging part.

In another aspect of the present invention there is provided a method of manufacturing a semiconductor device, comprising the steps of providing a wiring substrate, mounting a first packaging part on a surface of the wiring substrate, mounting a second packaging part on a back surface of the wiring substrate, the second packaging part being larger in the amount of heat generated than the first packaging part, sealing the first packaging part with resin to form a seal portion, and providing external terminals on the back surface of the wiring substrate.

DETAILED DESCRIPTION OF PREFERRED EMBODIMENTS

Figure 1:
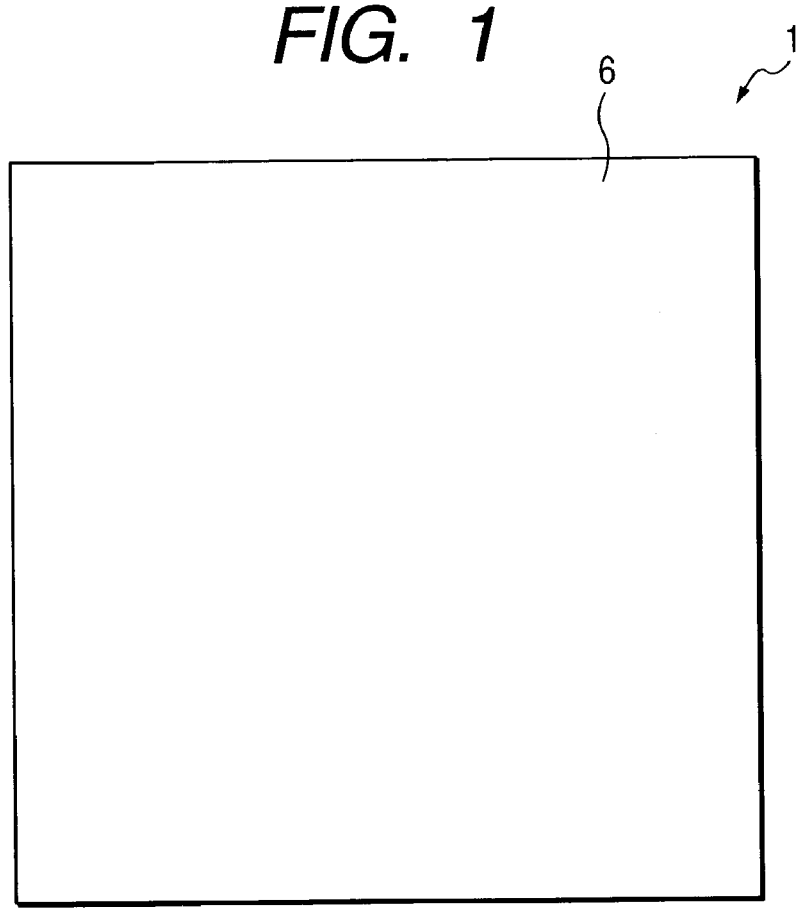
FIG. 1 is a plan view showing the structure of a power amplifier module as an example of a semiconductor device according to a first embodiment of the present invention.

Embodiments of the present invention will be described in detail hereinunder with reference to the accompanying drawings.

In the following embodiments, if necessary for convenience' sake, a description will be given in a divided manner into plural sections or embodiments, but unless otherwise mentioned, they are not unrelated to each other, but are in a relation such that one is a modification, details, or a supplementary explanation, of a part or the whole of the other.

In the following embodiments, when reference is made to, for example, the number of elements (including the number, numerical values, quantities, and ranges), it is to be understood that no limitation is made to the specific number referred to, but that numbers above and below the specific number are also employable, unless otherwise specified and except the case where a limitation is made to the specific number basically obviously.

In the following embodiments, it goes without saying that the constituent elements thereof (including element steps) are not always essential unless otherwise specified and except the case where they are considered essential basically obviously.

In the following embodiments, when reference is made, for example, to the shapes and positional relations of constituent elements or the like, it is to be understood that those substantially similar or closely similar to the shapes, etc. are also included unless otherwise specified and except the case where they are not so considered basically obviously.

In all of the drawings for explaining the embodiments, members having the same functions are identified by like reference numerals and repeated explanations thereof will be omitted.

(First Embodiment)

Figure 2:
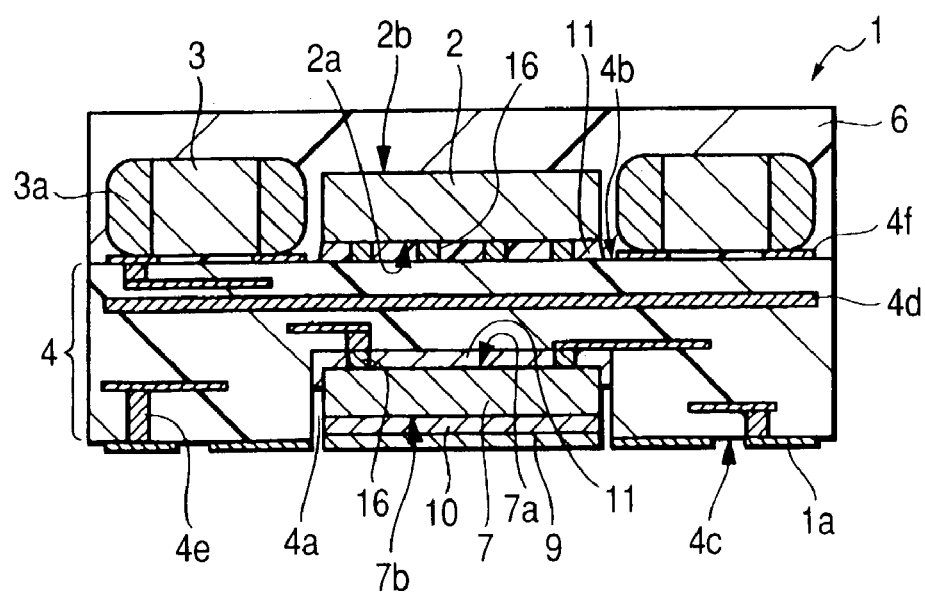
FIG. 2 is a sectional view thereof.
Figure 3:
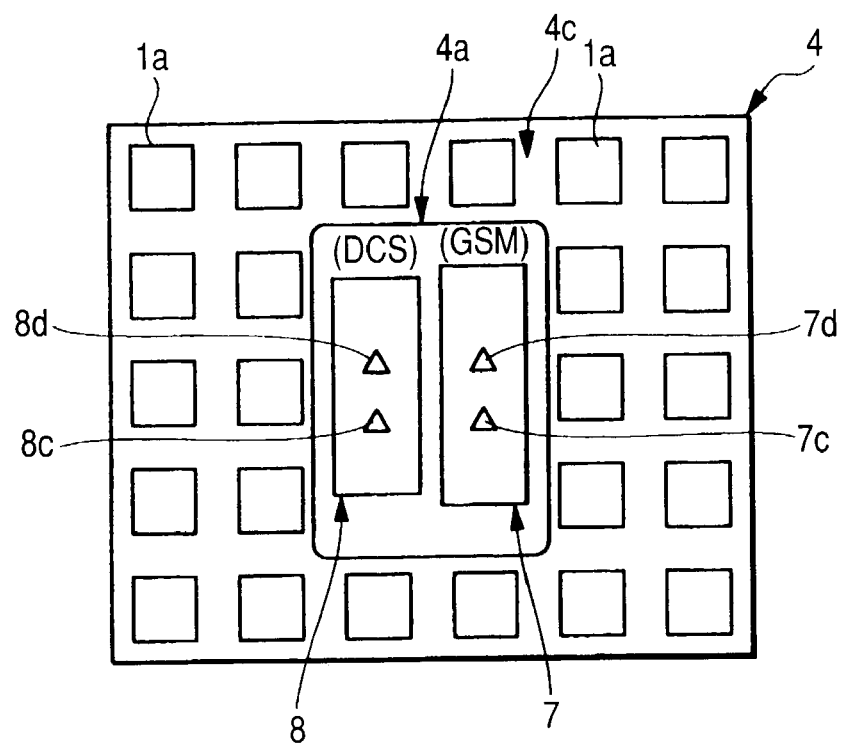
FIG. 3 is a bottom view thereof.
Figure 4:
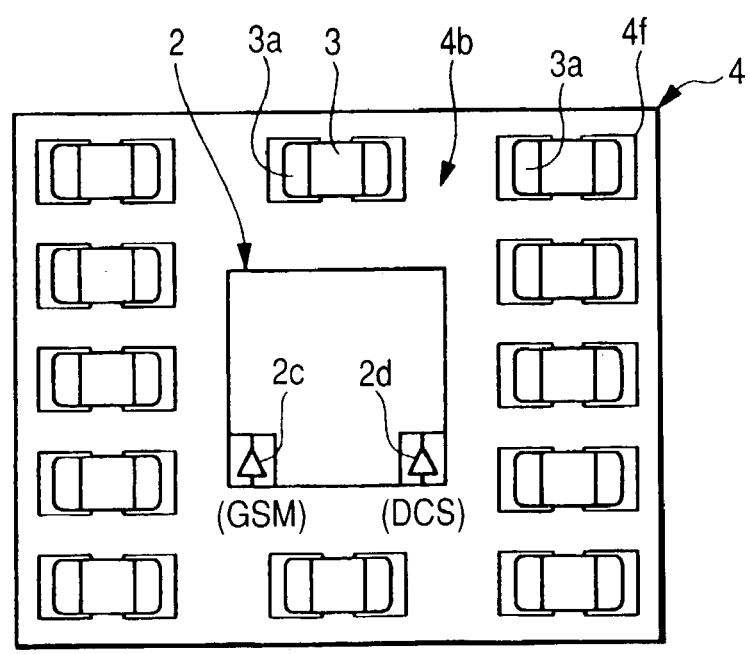
FIG. 4 is a layout plan view showing an example of layout of packaging parts mounted on a surface side of a wiring substrate in the power amplifier module shown in FIG. 1.
Figures 5, 6:
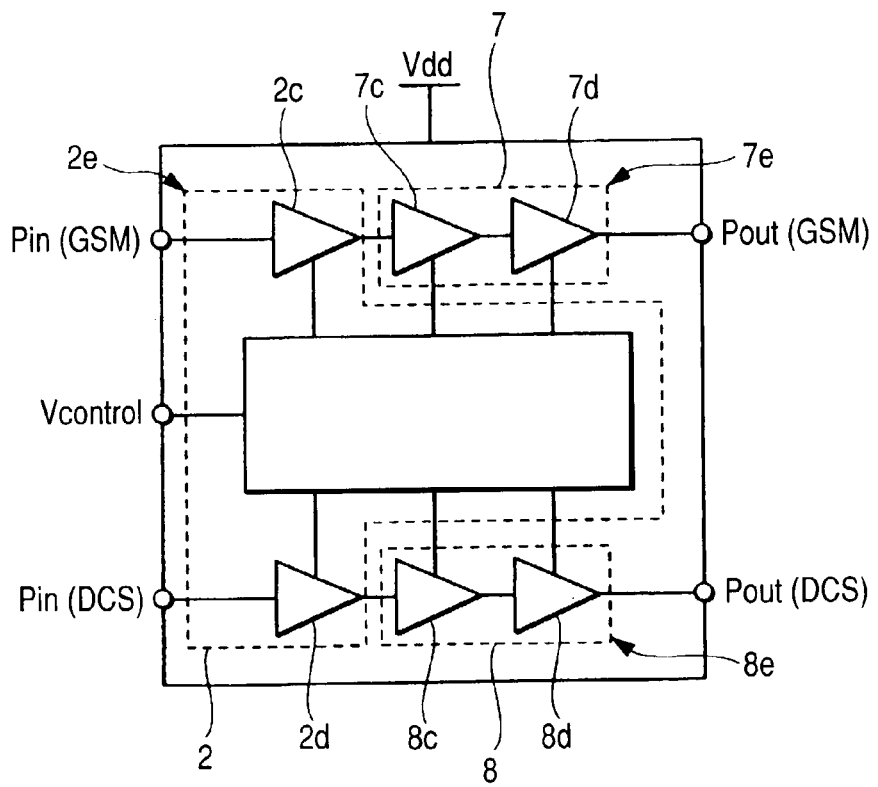
FIG. 5 is a circuit block diagram showing an example of configuration of a high frequency amplifier circuit incorporated in the power amplifier module shown in FIG. 1.
FIG. 6 is a comparative data diagram showing an example of chip power and thermal resistance values at various stages in the power amplifier module shown in FIG. 1.
Figure 7:
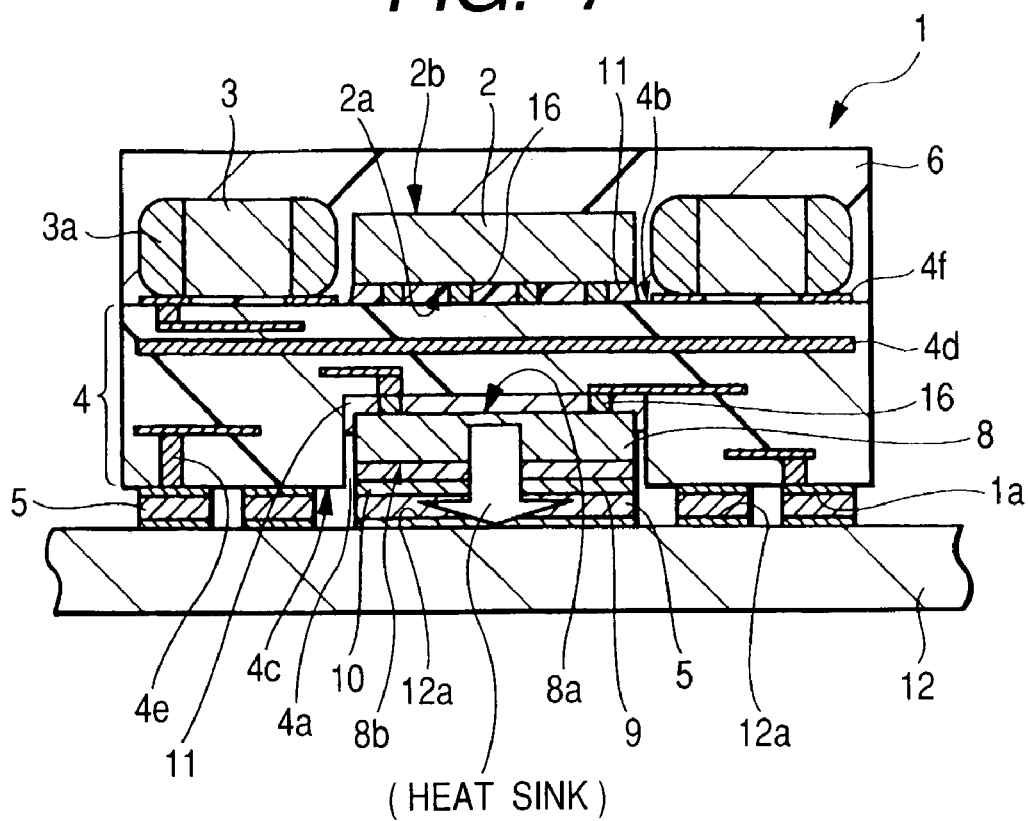
FIG. 7 is a partial sectional view showing an example of a packaging structure for mounting the power amplifier module shown in FIG. 1 onto a packaging substrate.
Figure 8:
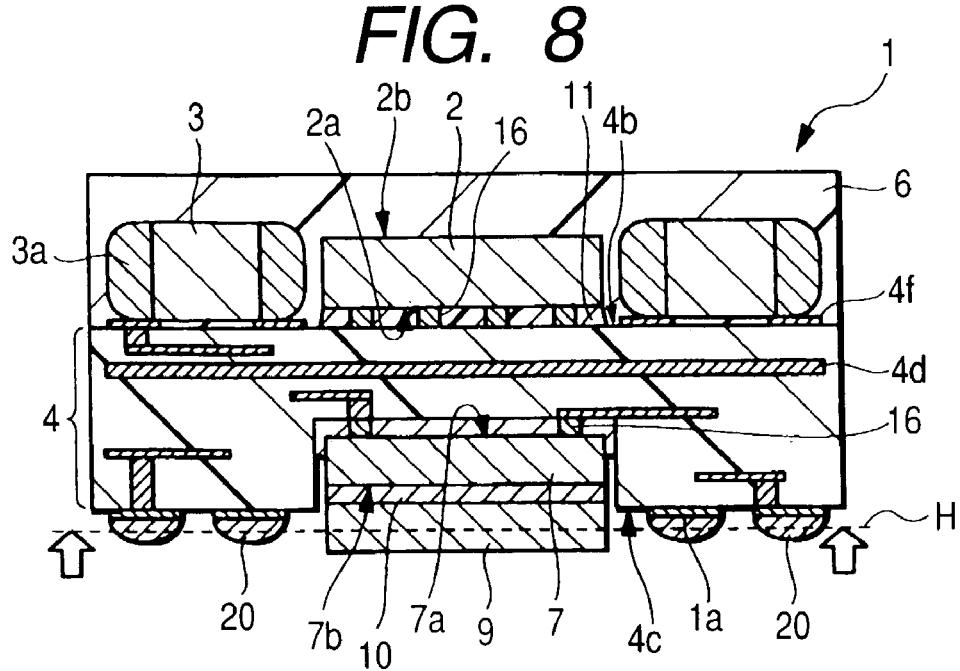
FIG. 8 is a sectional view showing an example of a method for polishing soldered portions in the amplifier module shown in FIG. 1.
Figure 9:
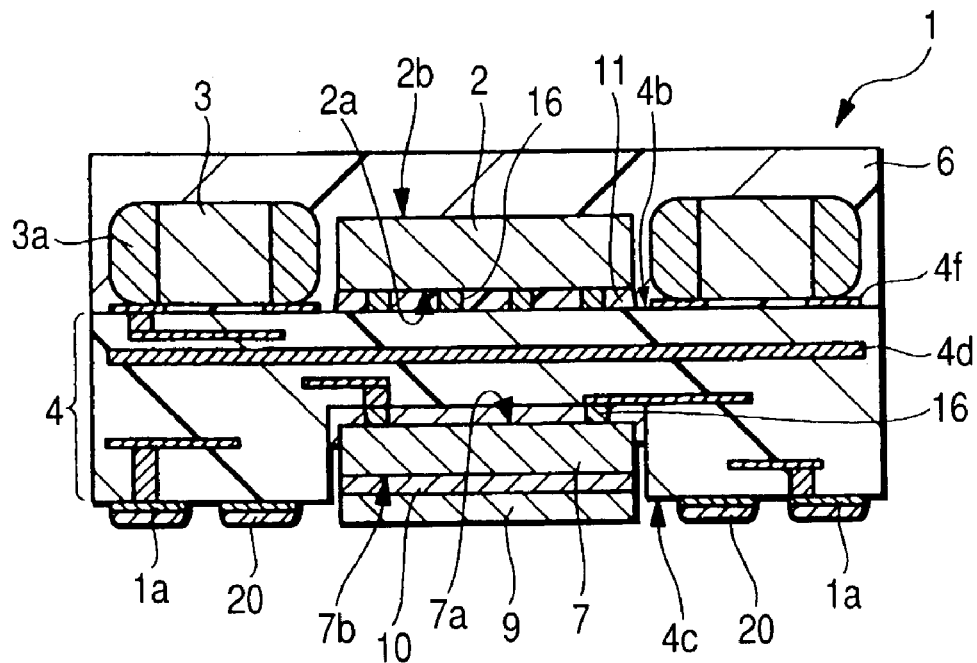
FIG. 9 is a sectional view showing an example of a structure after polishing the soldered portions in the power amplifier module shown in FIG. 1.
Figure 10:
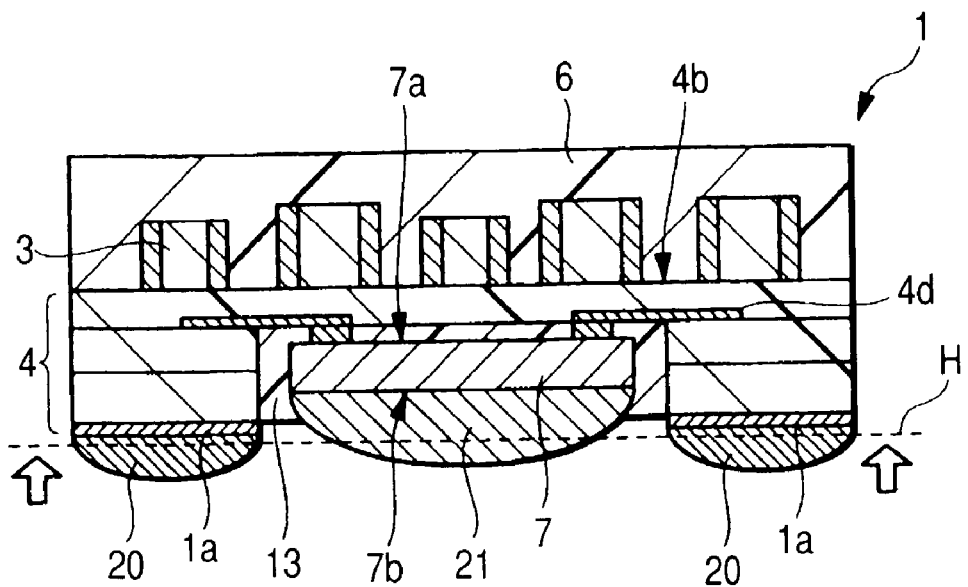
FIG. 10 is a sectional view showing a soldered portion polishing method according to a modification of the power amplifier module shown in FIG. 1.
Figure 11:
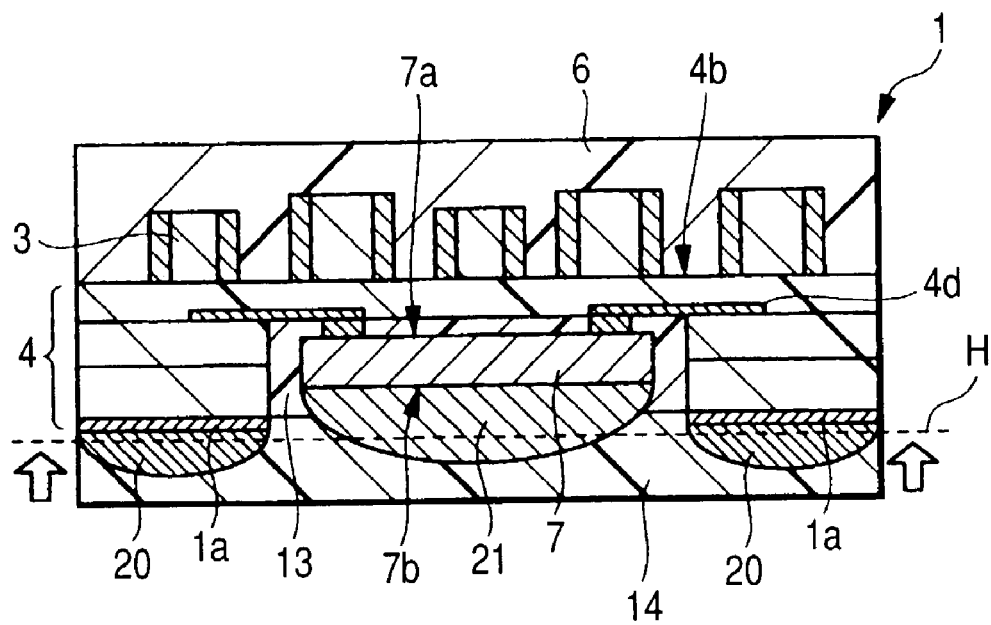
FIG. 11 is a sectional view showing a soldered portion polishing method according to another modification of the power amplifier module shown in FIG. 1.
Figure 12:
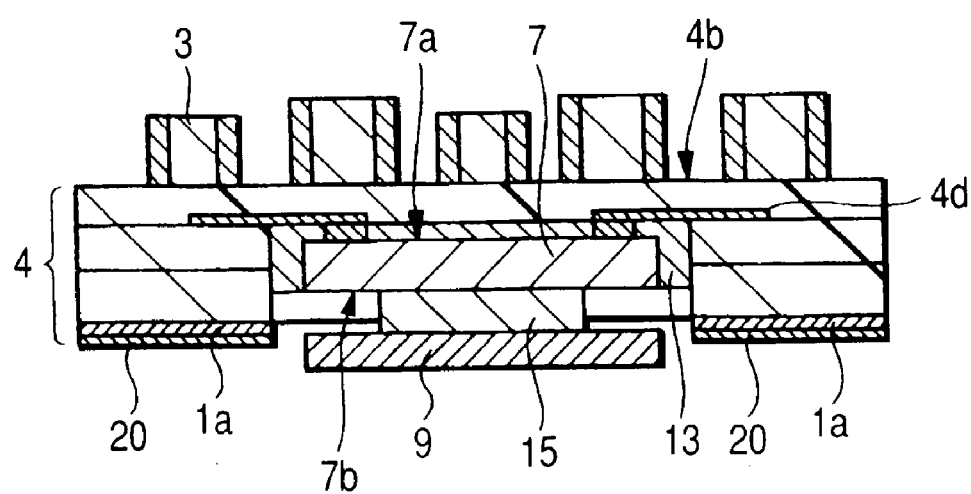
FIG. 12 is a sectional view showing a method for flattening external terminals and a radiation board according to a further modification of the power amplifier module shown in FIG. 1.
Figure 13:
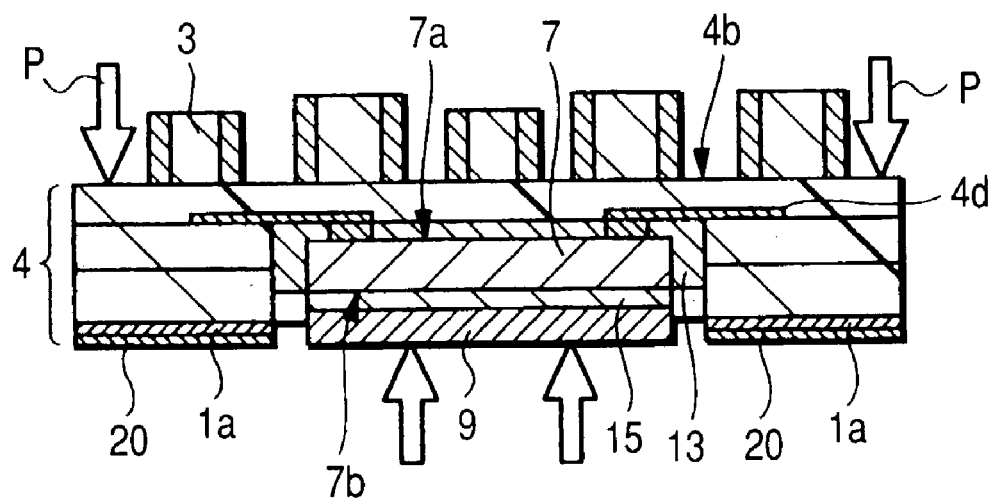
FIG. 13 is a sectional view showing a structure after flattening the external terminals and the radiation board in the power amplified module shown in FIG. 12.
Figure 14:
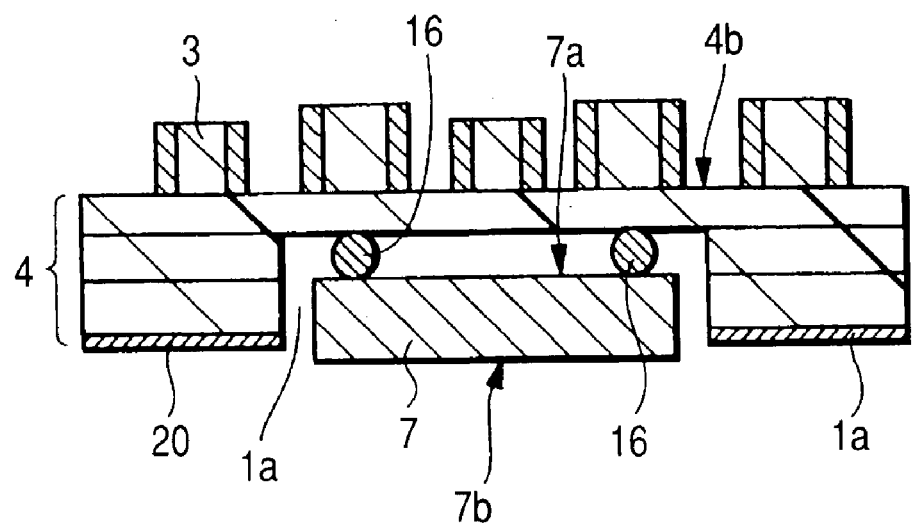
FIG. 14 is a sectional view showing a method for flattening external terminals and a radiation board according to a still further modification of the power amplifier module shown in FIG. 1.
Figure 15:
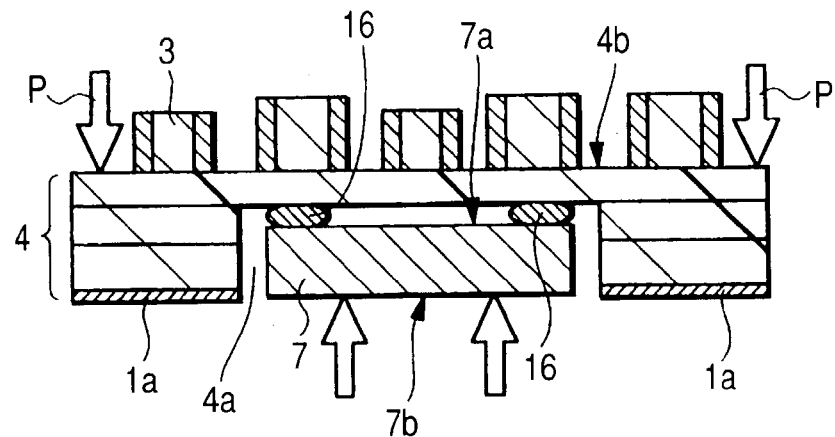
FIG. 15 is a sectional view showing a structure after flattening the external terminals and the radiation board in the power amplifier module shown in FIG. 14.

FIG. 1 is a plan view showing the structure of a power amplifier module as an example of a semiconductor device according to a first embodiment of the present invention, FIG. 2 is a sectional view thereof, FIG. 3 is a bottom view thereof, FIG. 4 is a layout plan view showing an example of layout of packaging parts mounted on a surface side of a wiring substrate in the power amplifier module shown in FIG. 1, FIG. 5 is a circuit block diagram showing an example of configuration of a high frequency amplifier circuit incorporated in the power amplifier module shown in FIG. 1, FIG. 6 is a comparative data diagram showing an example of chip power and thermal resistance values at various stages in the power amplifier module shown in FIG. 1, FIG. 7 is a partial sectional view showing an example of a packaging structure for mounting the power amplifier shown in FIG. 1 onto a packaging substrate, FIG. 8 is a sectional view showing an example of a method for polishing soldered portions in the amplifier module shown in FIG. 1, FIG. 9 is a sectional view showing an example of a structure after polishing the soldered portions in the power amplifier module shown in FIG. 1, FIGS. 10 and 11 are sectional views showing methods for polishing soldered portions according to modifications of the power amplifier module shown in FIG. 1, FIG. 12 is a sectional view showing a method for flattening external terminals and a radiation board according to a further modification of the power amplifier module shown in FIG. 1, FIG. 13 is a sectional view showing a structure after flattening the external terminals and the radiation board in the power amplifier module shown in FIG. 12, FIG. 14 is a sectional view showing a method for flattening external terminals and a radiation board according to a still further modification of the power amplifier module shown in FIG. 1, and FIG. 15 is a sectional view showing a structure after flattening the external terminals and the radiation board in the power amplifier module shown in FIG. 14.

The semiconductor device of this first embodiment, which is shown in FIGS. 1 and 2, is a high frequency module product called a power amplifier module 1. According to the structure of the power amplifier module 1, a first packaging part is soldered onto a surface 4b of a module substrate 4 and a second packaging part is soldered onto a back surface 4c of the packaging substrate, the first packaging part on the surface 4b side being covered with a sealing resin. This module is incorporated mainly in a small-sized portable electronic device such as a portable telephone set.

The power amplifier module 1 amplifies a high frequency, for example, in a portable telephone set in plural stages.

To be more specific, the power amplifier module 1 comprises a module substrate 4 as a wiring substrate having a surface 4b and a back surface 4c opposite to the surface, a control chip (a first semiconductor chip) 2 as a first packaging part mounted on the surface 4b of the module substrate 4, the control chip 2 being an active part, chip parts 3 mounted on the surface 4b in adjacency to the control chip 2 and having passive elements, a first output chip 7 and a second output chip 8, which are second packaging parts mounted on the back surface 4c of the module substrate 4 and which are second semiconductor chips having active elements (amplification elements), lands 1a as external terminals formed on the back surface of the module substrate 4, and a seal portion 6 formed by a sealing resin to seal the control chip 2 and the plural chip parts 3. The first and second output chips 7, 8 as second semiconductor chips are larger in the amount of heat generated than the control chip 2.

Thus, in the power amplifier module 1, the first and second output chips 7, 8 having amplification elements and large in the amount of heat generated are disposed on the back surface 4c of the module substrate 4, and when mounting these semiconductor chips onto a packaging substrate, the semiconductor chips are soldered to the packaging substrate directly or indirectly to enhance the heat radiation performance. On the other hand, the control chip 2 and chip parts 3, which are small in the amount of heat generated, are mounted on the surface 4b side of the module substrate 4 and these packaging parts on the surface 4b side are sealed with only a sealing resin low in elasticity and insulative such as a silicone resin without using a metallic case or the like, thereby attaining the reduction in size of the module.

In the power amplifier module 1 of this first embodiment, a cavity 4a as a recess is formed nearly centrally on the back surface 4c of the module substrate 4. As shown in FIG. 3, the first and second output chips 7, 8 are arranged side by side within the cavity 4a and are flip-chip-bonded to the module substrate 4. Further, the control chip 2 is flip-chip-bonded onto the surface 4b of the module substrate 4.

Thus, the control chip 2 and the first and second output chips 8 are flip-chip-bonded to the module substrate 4 respectively through solder bump electrodes 16.

Further, as shown in FIG. 2, a radiation board 9 as a heat radiating member is attached through a heat-conductive adhesive 10 to a back side 7b opposite to a main surface 7a of the first output chip 7 (also true of the second output chip 8) which is large in the amount of heat generated.

In the power amplifier module 1 of this first embodiment, its external terminals are the lands 1a provided on the back surface 4c of the module substrate 4, which plural lands 1a are arranged around the cavity 4a, as shown in FIG. 3.

The plural chip parts 3 mounted on the surface 4b of the module substrate 4 have passive elements respectively and, as shown in FIG. 4, respective connecting terminals 3a are soldered to terminals 4f formed on the surface side 4b of the module substrate 4. Further, as shown in FIG. 2, the terminals 4f formed on the surface 4b side and the lands 1a formed on the back 4c side are connected with each other through internal wiring lines 4d and through hole wiring lines 4e.

The module substrate 4 is a multi-layer wiring substrate having plural wiring layers.

The first output chip 7 (also true of the second output chip 8) is under-filled with a sealing resin within the cavity 4a to form an under-filled seal portion 11.

Thus, in the cavity 4a, the under-filled seal portion 11 is formed between the main surface 7a of the first output chip 7 and the module substrate 4.

The power amplifier module 1 has three-stage amplification circuits, of which the first-stage amplification circuit is formed in the control chip (first semiconductor chip) 2 as the first packaging part on the surface 4b side, and the second- and final-stage amplification circuits are respectively formed in the first and second output chips 7, 8 as second packaging parts on the back surface 4c.

Although the first-stage amplification circuit is formed in the control chip 2 on the surface 4b side and the final-stage amplification circuits is formed in the first and second output chips 7, 8 on the back surface 4c, the second-stage amplification circuit may be formed in the control chip 2 on the surface 4b side or may be formed n the first and second output chips 7, 8 on the back surface 4c.

Also as to the first-stage amplification circuit, for the purpose of reducing the chip size, it may be formed in the first and second output chips 7, 8 on the back surface 4c.

In the power amplifier module 1 of this first embodiment, as shown in FIG. 5, two types of frequency bands are amplified dividedly in two amplification circuits. In each of the amplification circuits, amplification is performed in three stages. Each stage of amplification circuit is controlled by a control circuit in the control chip 2.

The two types of frequency bands will now be described. One is based on GSM (Global System for Mobile Communication), using a frequency band of 880 to 915 MHz, while the other is based on DCS (Digital Communication System 1800), using a frequency band of 1710 to 1785 MHz. The module in question can cope with both these systems.

Therefore, as shown in FIG. 5, the high frequency circuit is divided into three circuit blocks 2e, 7e, and 8e enclosed with dotted lines. In power amplifier module 1, the control chip 2, which is small in the amount of heat generated, is adopted for the circuit block 2e, while the first and second output chips 7, 8, which are large in the amount of heat generated, are adopted for the circuit blocks 7e and 8e.

In the power amplifier module 1 of this first embodiment, as to the semiconductor chips included in the three circuit blocks 2e, 7e, and 8e, the control chip 2 in the circuit block 2e small in the amount of heat generated is mounted on the surface 4b side of the module substrate 4, while the circuit blocks 7e and 8e large in the amount of heat generated are incorporated in the first and second output chips 7, 8 on the back surface 4c. As shown in FIG. 7, when the power amplifier module 1 is mounted to a mother board 12 as a packaging substrate, back sides 7b (see FIG. 2) and 8b of the first and second output chips 7, 8 which are large in the amount of heat generated are soldered to substrate terminals 12a of the mother board 12 through the radiation board 9 and soldered portions 5, whereby it is possible to enhance the heat radiation performance.

As to the chip parts, all of them are mounted on the surface 4b side of the module substrate 4 because they are small in the amount of heat generated.

Correspondingly to the circuit blocks 2e, 7e, and 8e, as shown in FIG. 5, a GSM-side first-stage amplifier 2c and a DCS-side first-stage amplifier 2d are incorporated in the control chip 2 on GSM side and DCS side, respectively, a GSM-side second-stage amplifier 7c and a GSM-side final-stage amplifier 7d are incorporated in the first output chip 7, further, a DCS-side second-stage amplifier 8c and a DCS-side final-stage amplifier 8d are incorporated in the second output chip 8.

Upon receipt of a control signal Vcontrol the control chip 2 shown in FIG. 5 controls the powers of the GSM-side first-, second- and final-stage amplifiers 2c, 7c, 7d (also true of DCS side). In this first embodiment, MOSFETs (Metal Oxide Semiconductor Field Effect Transistors) are used as amplifier elements. In this case, the control chip 2 controls the bias applied to the gate of each MOSFET and thereby controls the powers of outputs Pout (GSM) and Pout (DCS).

Using GSM-side amplifiers, thermal resistance values were simulated with respect to the control chip 2 mounted on the surface 4b side of the module substrate 4 and the first output chip 7 mounted on the back 4c side. There were obtained such results as shown in FIG. 6.

As shown in the same figure, in the case of the control chip 2, if the value of power is set at 0.2W, a thermal resistance constraint is 250° C./W or less, while a simulation value thereof is 70° C./W, thus falling under the constraint.

On the other hand, in the case of the first output chip 7, if the value of power is set at 8W or less under worst conditions, a thermal resistance constraint is 6° C./W or less, while a simulation value thereof is 3.9° C./W, thus found to be within the constraint also in the output chip. Since DCS side is smaller in the amount of heat generated than GSM side, it can be judged that if GSM side is within the constraint, so is the DCS side.

In the power amplifier module 1 of this first embodiment, such packaging parts as the control chip 2 and chip parts 3 mounted on the surface 4b of the module substrate 4 are sealed with an insulating sealing resin without using a metallic case or the like, so that it becomes unnecessary to consider an electric short between the packaging parts and the metallic case and hence an external size can be determined taking only the dicing accuracy for division into individual chips into account.

That is, since the division into individual chips can be done at positions closest to the mounted parts, it is possible to diminish a dead space (waste space) in the substrate periphery and hence possible to reduce the size of the power amplifier module 1.

In other word, since the packaging parts can be arranged up to positions closest to the outer periphery in the substrate range which permits the mounting of the parts, it is possible to improve the packaging density of parts.

Further, it is not that chips are mounted on either the surface 4b or the back surface 4c of the module substrate 4, but the first-stage control chip 2 is mounted on the surface 4b, while the final-stage first and second output chips 7, 8 are mounted on the back surface 4c. Thus, the first- and final-stage chips are mounted on the surface and the back surface dividedly between the first and the final stage, whereby the packaging area can be diminished and it is possible to attain the reduction in size of the power amplifier module 1.

The first and second output chips 7, 8, which are large in the amount of heat generated, are mounted on the back surface 4c of the module substrate 4. Further, at the time of mounting the power amplifier module 1 onto the mother board 12, the chips are mounted by soldering through the radiation board 9 and soldered portions 5, whereby the heat generated from the first and second output chips 7, 8, which are large in the amount of heat generated, can be transmitted directly to the substrate and consequently the thermal resistances of both chips can be decreased.

Further, since semiconductor chips are flip-chip-connected to both the surface and the back surface of the module substrate 4 through bump electrodes 16, the semiconductor chips can be made difficult to be influenced by the generated heat. This is because a high thermal resistance of the bump electrodes 16 makes the heat of the semiconductor chips on the back surface 4c difficult to be transmitted to the surface 4b-side semiconductor chip.

Therefore, it is possible to enhance the heat radiation performance of the first and second output chips 7, 8 which are large in the amount of heat generated, and hence possible to attain a high output operation of the power amplifier module 1.

As a result, the power amplifier module 1 can be operated in a high temperature environment.

Next, the following description is provided about a method of manufacturing the semiconductor device (power amplifier module 1) of this first embodiment.

First, a module substrate (wiring substrate) 4 having a surface 4b and a back surface 4c is provided.

Thereafter, a control chip 2 and chip parts 3 are mounted on the surface 4b of the module substrate 4.

More specifically, the control chip 2 and chip parts 3 are arranged on the surface 4b of the module substrate 4 in such a manner that a back side 2b of the control chip 2 is turned upward, that is, a main surface 2a of the control chip becomes opposed to the surface 4b of the module substrate 4, and that the chip parts 3 are positioned on terminals 4f. Thereafter, the control chip 2 and the chip parts 3 are mounted by reflow for example. The control chip 2 is flip-chip-bonded to the module substrate through solder bump electrodes 16.

Thereafter, the module substrate 4 is turned upside down, allowing the back surface 4c to face upward. Then, first and second output chips 7, 8 are arranged in a cavity 4a in such a manner that respective back sides 7b and 8b face upward, followed by flip-chip bonding of the two by reflow. The first and second output chips 7, 8 are larger in the amount of heat generated than the control chip 2.

Subsequently, sealing is performed with resin.

More specifically, the packaging parts on the surface 4b side of the module substrate are sealed by resin molding, while the back surface 4c is subjected to under-fill sealing within the cavity 4a.

As a result, a seal portion 6 is formed on the surface 4b side of the module substrate 4, while an under-fill seal portion 11 is formed in the cavity 4a on the back surface 4c.

The under-fill seal portion 11 is formed by pouring a sealing resin between a main surface 7a of the first output chip 7 and the module substrate 4 and also between a main surface 8a of the second output chip 8 and the module substrate 4.

Thereafter, a radiation board 9 is attached to the back sides 7b and 8b of the first and second output chips 7, 8 through a heat-conductive adhesive 10.

The assembly of the power amplifier module 1 is now completed.

In the power amplifier module of this first embodiment, in order to improve the packaging performance at the time of connecting the radiation board 9 to a substrate, followed by mounting onto a mother board 12, as shown in FIG. 7, it is preferable that after the assembly of the power amplifier module 1, as shown in FIG. 8, first soldered portions 20 be formed on lands 1a respectively and then the radiation board 9 and the first soldered portions 20 be polished so that both are flush with each other.

Unless the height of the lands 1a and that of the radiation board 9 are equal to each other, there may occur a connection imperfection in either the radiation board 9 or the lands 1a at the time of mounting the power amplifier module 1 onto the mother board 12. To avoid this inconvenience, the radiation board 9 is projected beforehand with respect to the lands 1a and in this state the first soldered portions 20 and the radiation board 9 are polished inwards from the lands 1a side up to the height of a broken line H, whereby the first soldered portions 20 and the radiation board 9 can be made flush with each other, as shown in FIG. 9.

By so doing, the flatness of the first soldered portions 20 and that of the radiation board 9 are improved and therefore, when mounting the power amplifier module 1 onto the mother board 12, it is possible to ensure a uniform soldered shape without tilting of the power amplifier module, whereby it is possible to effect a secondary packaging with improved stability and reliability.

As a result, it is possible to improve the packaging performance of the power amplifier module 1.

It is FIGS. 10 to 15 that illustrate various means for connecting the second semiconductor chip (although reference will be made to only the first output chip 7, the following description also applies to the second output chip 8) to the packaging substrate through a heat radiating member, the second semiconductor chip being mounted on the back 4c side of the module substrate 4 and being large in the amount of heat generated.

FIG. 10 shows a case where the radiation board 9 is not used, but the heat radiating member connected to the back side 7b of the first output chip 7 is a second soldered portion 21 formed by solder. According to the method illustrated in FIG. 10, first soldered portions 20 are formed on lands 1a respectively and the second soldered portion 21 is formed on the back side 7b of the first output chip 7, then the first soldered portions 20 formed on the lands 1a and the second soldered portion 21 are polished up to the height of a broken line H to make the two flush with each other.

Thus, the radiation board 9 is substituted by solder which is a soft material easier to polish than the radiation board 9, whereby the polishing work can be simplified. Besides, since the radiation board 9 is substituted by solder as a heat radiating member, it is possible to decrease the number of assembling steps.

In the power amplifier module 1 shown in FIG. 10, the first output chip 7 is sealed with a back-side chip seal portion 13 using resin.

FIG. 11 shows a structure wherein the structure shown in FIG. 10 is further covered with a polishing seal portion 14.

To be more specific, first soldered portions 20 are formed on lands 1a respectively and a second soldered portion 21 is formed on the back side 7b of the first output chip 7, using solder as a heat radiating member which solder is softer than the radiation board 9, thereafter, the first and second soldered portions 20, 21 are sealed with resin to form a seal portion 14 for polishing.

Subsequently, the seal portion 14 for polishing, as well as the first and second soldered portions 20, 21, are polished up to the height of a broken line H, allowing the soldered portions 20, 21 to be exposed and making the two flush with each other.

That is, in the structure shown in FIG. 11, the first output chip 7 is covered with the back-side chip seal portion 13 and further the seal portion 14 for polishing, which is formed using a material softer than the back-side chip seal portion 13, e.g., an epoxy resin, is laminated to the back-side chip seal portion.

According to this structure, during polishing, the second soldered portion 21 is held by the seal portion 14 for polishing, whereby it is possible to diminish the load imposed on the first output chip 7 and the lands 1a.

FIG. 12 shows a case where a radiation board 9 is used as a heat radiating member, and a soldered portion 15 for the radiation board is formed between the first output chip 7 and the radiation board 9 so as to be slightly smaller and thicker than the radiation board 9 and the first output chip 7.

In this case, polishing is not performed, but at the time of reflowing the packaging parts on the surface 4b side of the module substrate 4, as shown in FIG. 13, soldered portion 15 for the radiation board mounted to the back side 7b of the first output chip 7 is melted by the application of load P, allowing the solder to be spread thin by the own weight of the module, whereby the lands 1a and the radiation board 9 can be made flush with each other and it is possible to improve the flatness of the two.

FIG. 14 shows a structure in which the radiation board 9 is not used, but solder bump electrodes 16 for flip-chip bonding of the first output chip 7 are formed large. As shown in FIG. 15, like FIG. 13, when reflowing the packaging parts on the surface 4b side of the module substrate 4, the large bump electrodes 16 for flip-chip bonding are melted by the application of load P, allowing the solder to be spread thin by the own weight of the module, whereby the lands 1a and the back side 7b of the first output chip 7 can be made flush with each other and it is possible to improve the flatness of the two.

According to the structure shown in FIG. 14, since the radiation board 9 is not used, it is possible to thin the module substrate 4 and hence possible to lower the height of the module (product).

(Second Embodiment)

Figure 16:
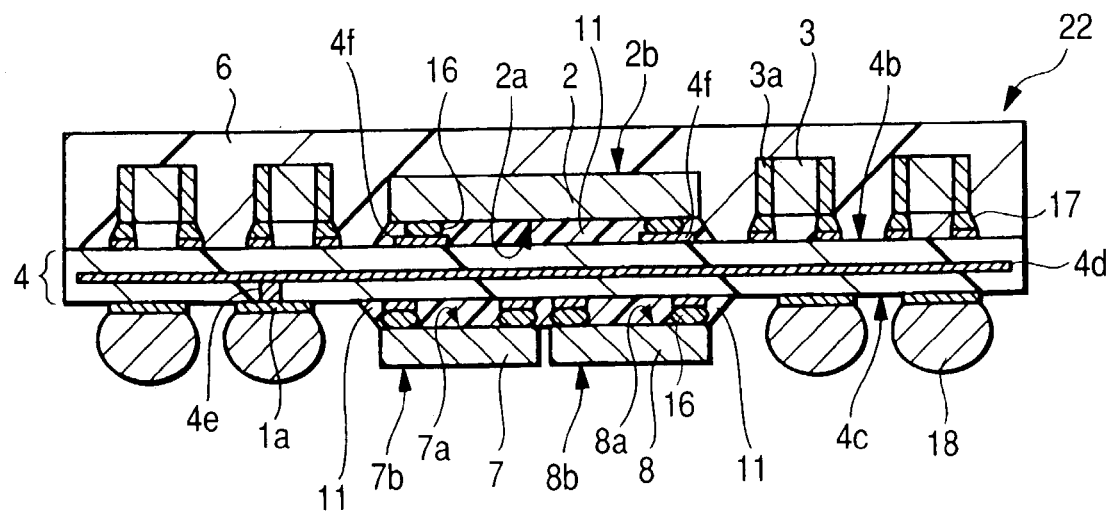
FIG. 16 is a sectional view showing the structure of a power amplifier module as an example of a semiconductor device according to a second embodiment of the present invention.
Figure 17:
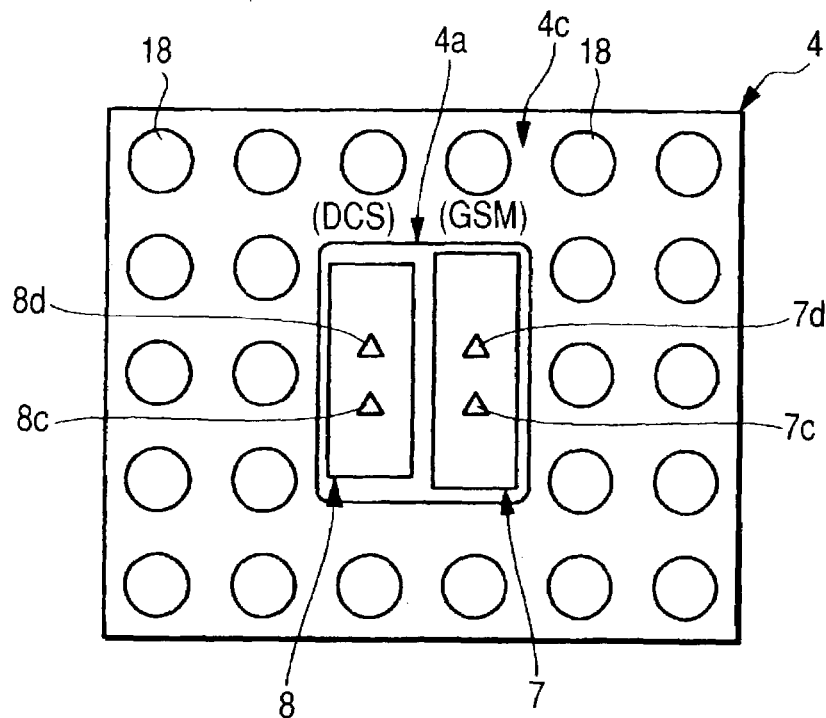
FIG. 17 is a bottom view thereof.
Figure 18:
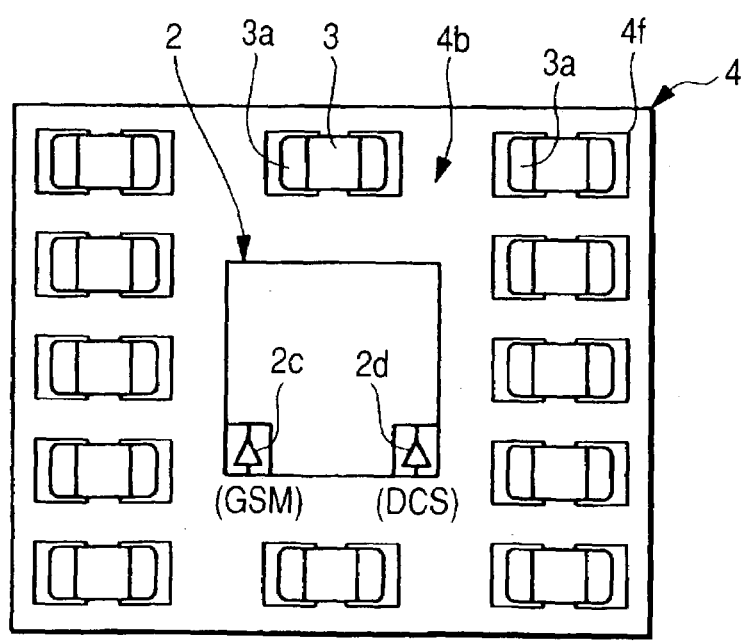
FIG. 18 is a layout plan view showing an example of layout of packaging parts mounted on a surface side of a wiring substrate in the power amplifier module shown in FIG. 16.
Figure 19:
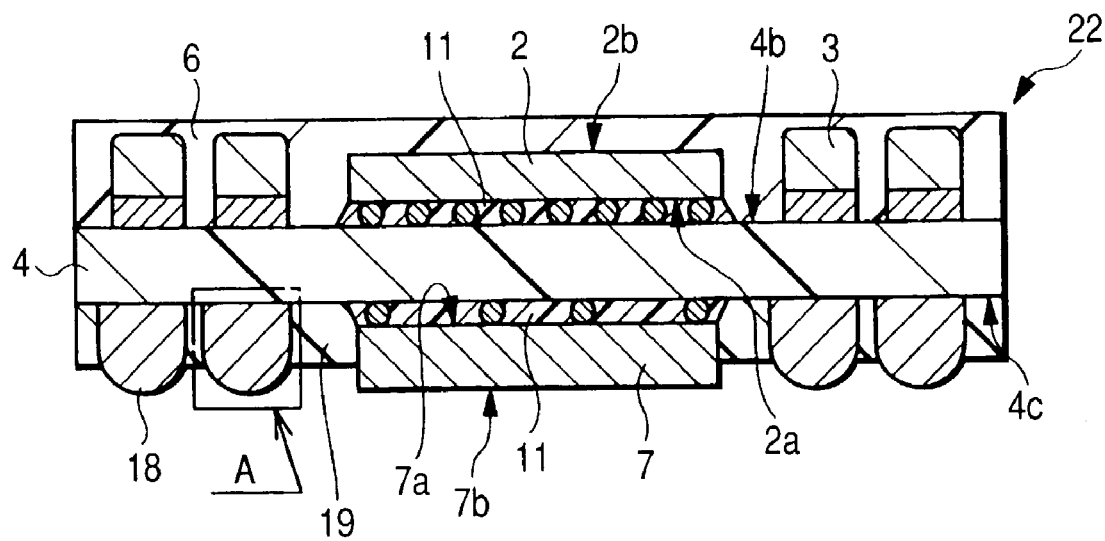
FIG. 19 is a sectional view showing the structure of a power amplifier module according to a modification of the second embodiment of the present invention.
Figure 20:
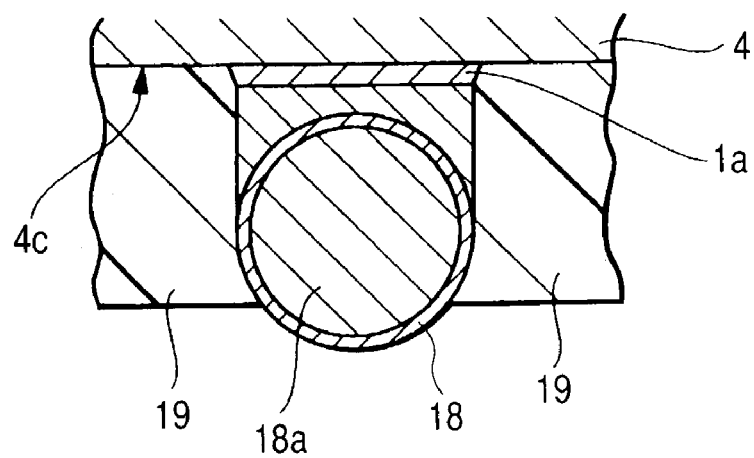
FIG. 20 is a partial enlarged sectional view showing the structure of portion A in FIG. 19.

FIG. 16 is a sectional view showing the structure of a power amplifier module as an example of a semiconductor device according to a second embodiment of the present invention, FIG. 17 is a bottom view thereof, FIG. 18 is a layout plan view showing an example of layout of packaging parts mounted on a surface side of a wiring substrate in the power amplifier module shown in FIG. 16, FIG. 19 is a sectional view showing the structure of a power amplifier module according to a modification of the second embodiment of the present invention, and FIG. 20 is a partial enlarged sectional view showing the structure of portion A in FIG. 19.

As in the first embodiment, the semiconductor device of this second embodiment is a power amplifier module 22, which is different from the power amplifier module 1 of the first embodiment in that the cavity 4a as a recess is not formed on the back surface 4c of the module substrate 4.

Therefore, it is necessary that the height of external terminals be equal to the mounted height of the first and second output chips 7,8 which are mounted on the back surface 4c. For this reason, in the second embodiment, reference will be made to the case where external terminals are solder bumps 18 as salient electrodes.

The reason why the power amplifier module 22 is of BGA (Ball Grid Array) structure is because the back sides 7b, 8b of the first and second output chips 7, 8 must be made substantially flush with the external terminals. But the external terminals may be pins or the like.

At the time of equalizing the height of the back sides 7b, 8b of the first and second output chips 7, 8 with the height of solder bumps 18, it is preferable that the solder bumps 18 be slightly projected with respect to those back sides.

By so doing, when mounting the power amplifier module onto the packaging substrate by reflow, it is possible to ensure connection of the solder bumps 18 and the first and second output chips 7, 8 to the packaging substrate.

In the power amplifier module 22, unlike the power amplifier module 1 of the first embodiment, the radiation board 9 is not used, so that the first and second output chips 7, 8 can be connected to the packaging substrate directly with solder alone.

As shown in FIG. 17, plural solder bumps 18 are arranged around the under-fill seal portion 11.

As in the power amplifier module 1 of the first embodiment, the first and second output chips 7, 8 as second semiconductor chips are flip-chip-bonded to the back surface 4c of the module substrate 4. Further, the under-fill seal portion 11 is formed with resin between each of the first and second output chips 7, 8 and the back surface 4c of the module substrate 4.

As shown in FIG. 18, on the surface 4b side of the module substrate 4 a control chip 2 is mounted nearly centrally and plural chip parts 3 are mounted around the control chip 2 through soldered portions 17 as in FIG. 16.

Other structural points in the power amplifier module 22 of this second embodiment are the same as in the power amplifier module of the first embodiment, so tautological explanations thereof will here be omitted.

According to the power amplifier module 22, like the power amplifier module 1 of the first embodiment, it is possible to attain the reduction in size thereof; besides, since the cavity 4a as a recess is not formed in the module substrate 4, it is possible to simplify the structure of the module substrate 4 and hence possible to reduce the cost of the module substrate.

Consequently, it is possible to reduce the cost of the power amplifier module 22.

Moreover, since the first and second output chips 7, 8 can be connected to the packaging substrate directly through only solder without interposition of the radiation board 9 therebetween, it is possible to further enhance the heat radiation performance of the power amplifier module 22.

Additionally, the power amplifier module 22 can be made thin because the radiation board 9 is not used.

Other effects obtained by the power amplifier module 22 of this second embodiment are the same as in the case of the power amplifier module 1 of the first embodiment, so tautological explanations thereof will here be omitted;

Referring now to FIGS. 19 and 20, there is illustrated a modification of the power amplifier module 22.

In a power amplifier module 22 shown in FIG. 19, a metal core 18a as a metal ball is provided in the interior of each solder bump 18 which serves as an external terminal, and on the back surface 4c of the module substrate 4 there are formed a first output chip 7, plural solder bumps 18 around the first output chip 7, and a back-side seal portion 19 which covers side portions of the first output chip 7 and the plural solder bumps 18.

The metal core 18a is formed of copper for example, and the solder bumps 18 each containing the metal core 18a prevent solder from melting down for example at the time of secondary packaging on the user side.

More particularly, the height of the back-side seal portion 19 from the back surface 4c of the module substrate 4 is set at a height corresponding to half or more of each solder bump 18, whereby the solder bumps 18 can be prevented from melting down at the time of repair after the secondary packaging, and hence it is possible to retain the original shape of the solder bumps 18.

Therefore, it is possible to realize a power amplifier module 22 having a structure suitable for repair.

Although the present invention has been described above concretely on the basis of embodiments thereof, it goes without saying that the invention is not limited to the above embodiments, but that various changes may be made within the scope not departing from the gist of the invention.

For example, although in the first and second embodiments a silicone resin is used as the resin for forming the seal portion 6, there may be used a resin other than the silicone resin, e.g., an epoxy resin.

Although the semiconductor devices of the first and second embodiments are the power amplifier modules 1 and 22, they may be other high frequency modules or semiconductor modules insofar as the modules are of the structure wherein semiconductor chips are mounted on both surface and back of the module substrate 4 in such manner that a semiconductor chip larger in the amount of heat generated than on the surface side is mounted on the back surface, and the surface side of the module substrate 4 is sealed with a sealing resin alone without using a metallic case or the like.

Further, packaging parts mounted on a wiring substrate such as the module substrate 4 are not limited to chip parts and semiconductor chips, but may be other electronic parts.

The following is a brief description of an effect obtained by typical inventions disclosed herein.

A first packaging part is mounted on a surface of a wiring substrate, while a second packaging part larger in the amount of heat generated than the first packaging part is mounted on a back surface of the wiring substrate, further, a resin seal portion is formed to seal the first packaging part. Thus, the semiconductor device concerned is not covered with a metallic case and hence it is possible to attain the reduction in size thereof.

What is claimed is:

1. A semiconductor device having a power amplification circuit, comprising:
   a wiring substrate having a main surface and a back surface opposite to the main surface;
   a first semiconductor chip mounted over the main surface of the wiring substrate;
   a second semiconductor chip mounted over the back surface of the wiring substrate,
   a plurality of external terminals provided over the back surface of the wiring substrate;
   a sealing portion covering the first semiconductor chip; and
   a control circuit formed in the first semiconductor chip;
   wherein the control circuit controls the power amplification circuit;
   the power amplification circuit is comprised of serially coupled plural-stage circuits;
   the plural-stage circuits include a first-stage circuit and a final-stage circuit;
   the first stage circuit of the power amplification circuit is formed in the first semiconductor chip;
   the final-stage circuit of the power amplification circuit is formed in the second semiconductor chip; and
   the second semiconductor chip is larger in an amount of heat generated than the first semiconductor chip.

2. A semiconductor device according to claim 1, wherein a passive element electrically coupled with the power amplification circuit is disposed over the main surface of the wiring substrate.

3. A semiconductor device according to claim 1, wherein a recess portion is formed on the back surface of the wiring substrate; and
   the second semiconductor chip is disposed in the recess portion.

4. A semiconductor device according to claim 1, wherein the sealing portion is comprised of a resin.

5. A semiconductor device according to claim 1, wherein the second semiconductor chip is flip-chip-bonded to the back surface of the wiring substrate.

6. A semiconductor device according to claim 1, wherein a main surface of the second semiconductor chip is mounted to the back surface of the wiring substrate; and
   a heat radiating member is attached to a back surface of the second semiconductor chip.

7. A semiconductor device according to claim 1, wherein a through hole wiring line is formed in the wiring substrate; and
   the first and second semiconductor chips are electrically coupled via the through hole wiring line.

8. A semiconductor device according to claim 1, wherein an under-filled seal portion is formed between the second semiconductor chip and the back surface of the wiring substrate.

9. A semiconductor device according to claim 1, wherein the semiconductor device is adapted to be mounted on a portable electronic device.

10. A semiconductor device having a power amplification circuit with a first operating frequency, a power amplification circuit with a second operating frequency and a control circuit, comprising:
    a wiring substrate having a main surface and a back surface opposite to the main substrate;
    a first semiconductor chip mounted over the main surface of the wiring substrate;
    a second semiconductor chip mounted over the back surface of the wiring substrate;

a third semiconductor chip mounted over the back surface of the wiring substrate;

a passive element mounted over the main surface of the wiring substrate;

a plurality of external terminals provided over the back surface of the wiring substrate; and a sealing portion covering the first semiconductor chip and passive element;

wherein the control circuit controls the power amplification circuits with the first and second operating frequencies;

each of the power amplification circuits with the first and second operating frequencies is comprised of serially coupled plural-stage circuits;

the plural-stage circuits include a first-stage circuit and a final-stage circuit;

the first-stage circuits of the power amplification circuits with the first and second frequencies and the control circuit are formed in the first semiconductor chip;

the final-stage circuit of the power amplification circuits with the first frequency is formed in the second semiconductor chip;

the final-stage circuit of the power amplification circuits with the second frequency is formed in the third semiconductor chip; and the second and third semiconductor chips are larger in an amount of heat generated than the first semiconductor chip.

11. A semiconductor device according to claim 9, wherein the power amplification circuits with the first and second operating frequencies are used for GSM and DCS respectively.

* * * * *